(12) United States Patent
Fricker

(10) Patent No.: US 8,981,693 B2
(45) Date of Patent: Mar. 17, 2015

(54) METHOD AND APPARATUS FOR DETERMINING A ZERO CROSSING OF A PHASE CURRENT OF AN ELECTRONICALLY COMMUTATED ELECTRICAL MACHINE, IN PARTICULAR FOR DETERMINING A ROTOR POSITION OF THE ELECTRICAL MACHINE

(75) Inventor: David Fricker, Oberhoffen sur Moder (FR)

(73) Assignee: Robert Bosch GmbH, Stuttgart (DE)

( * ) Notice: Subject to any disclaimer, the term of this patent is extended or adjusted under 35 U.S.C. 154(b) by 120 days.

(21) Appl. No.: 13/700,748

(22) PCT Filed: Apr. 14, 2011

(86) PCT No.: PCT/EP2011/055882
§ 371 (c)(1),
(2), (4) Date: Nov. 29, 2012

(87) PCT Pub. No.: WO2011/151101
PCT Pub. Date: Dec. 8, 2011

(65) Prior Publication Data
US 2013/0069574 A1 Mar. 21, 2013

(30) Foreign Application Priority Data
Jun. 1, 2010 (DE) .......................... 10 2010 029 558

(51) Int. Cl.
*H02P 6/18* (2006.01)
*G01R 19/175* (2006.01)
(52) U.S. Cl.
CPC *H02P 6/18* (2013.01); *H02P 6/182* (2013.01); *G01R 19/175* (2013.01)

USPC .................................. 318/400.32; 318/400.34
(58) Field of Classification Search
USPC ........................... 318/400.32, 400.34, 400.35
See application file for complete search history.

(56) References Cited

U.S. PATENT DOCUMENTS 4,686,436 A * 8/1987 Archer ..................... 318/400.26
6,249,094 B1 6/2001 Zeh et al.
(Continued)

FOREIGN PATENT DOCUMENTS

| CN | 1426163 | 6/2003 |
| DE | 102008018811 | 10/2009 |
| JP | 2009033922 | 2/2009 |

OTHER PUBLICATIONS

International Search Report for Application No. PCT/EP2011/055882 dated Jul. 25, 2012 (2 pages).

*Primary Examiner* — Bentsu Ro
(74) *Attorney, Agent, or Firm* — Michael Best & Friedrich LLP

(57) ABSTRACT

A method for determining a time for a zero crossing of a phase current in a polyphase electrical machine (2). The method including driving a driver circuit (31; 50) for providing phase voltages to operate the electrical machine (2); deactivating a pulse-width-modulated driving by at least one power switch (36, 37; 52, 53), such that no potential is applied to connecting nodes (A1, A2, B1, B2) by the driver circuit (31; 50), at least during a time segment in each cycle of the pulse width modulation; detecting a diode voltage via a freewheeling diode, with which the deactivated power switch (36, 37; 52, 53) has been provided, within the time segment; and fixing the time for the zero crossing of the phase current as the time after which there is no longer a diode voltage present across the freewheeling diode (40; 54) within the time segment.

9 Claims, 7 Drawing Sheets

(56) References Cited

U.S. PATENT DOCUMENTS

| | | | |
|---|---|---|---|
| 6,577,097 B2 * | 6/2003 | Krefta et al. | 318/801 |
| 7,102,307 B2 * | 9/2006 | Shao | 318/400.35 |
| 2011/0156664 A1 * | 6/2011 | Horihata | 322/24 |

* cited by examiner

METHOD AND APPARATUS FOR DETERMINING A ZERO CROSSING OF A PHASE CURRENT OF AN ELECTRONICALLY COMMUTATED ELECTRICAL MACHINE, IN PARTICULAR FOR DETERMINING A ROTOR POSITION OF THE ELECTRICAL MACHINE

BACKGROUND OF THE INVENTION

The invention relates to electric machines, in particular electronically commutated electric machines, in which a zero crossing of a winding phase current is detected for actuation, in particular for determination of the rotor position.

Electronically commutated electric machines, such as synchronous motors, asynchronous motors and the like, for example, are known from the prior art. Such an electric machine has a passive rotor, which can be provided with permanent magnets, for example, in order to form rotor poles. A drive force is exerted on the rotor by an external magnetic field being produced. The external magnetic field needs to be generated depending on the present rotor position, with the result that knowledge of the instantaneous rotor position of the rotor is necessary for actuation of such an electronically commutated electric machine.

The external magnetic field is produced with the aid of a stator winding, generally with a plurality of phases. The rotor position is used to determine the phase voltages to be applied to the stator winding and to apply these phase voltages to the winding phases of the stator winding.

The electric machine is actuated with the aid of a driver circuit, which is often formed with the aid of inverter circuits, in order to actuate the winding phases of the electric machine with the aid of H bridge or B6 bridge circuits. The actuation takes place in accordance with an energization pattern which is dependent on the instantaneous rotor position and is selected such that a stator magnetic field produced by the phase voltage is provided so as to lead the exciting magnetic field of the permanent magnets in the rotor in the direction of rotation in order to provide a drive torque.

Methods for detecting the rotor position are sufficiently well known from the prior art. Firstly, the present rotor position can be detected with the aid of a position detector, which gives an indication of the instantaneous rotor position on the basis of an analog or digital measurement signal of a corresponding actuation unit for the electric machine. Such position detectors can detect the instantaneous rotor position with the aid of a plurality of Hall sensors or GMR (Giant Magnetic Resistance) sensors. For this purpose, said sensors can be arranged close to the rotor poles of the rotor or on a magnetic sensor wheel and can indicate the position of the rotor on the basis of the intensity and direction of the magnetic field measured by the position detectors.

Secondly, the rotor position of the rotor of the electric machine can also be detected in accordance with a so-called back-EMF method by evaluation of a profile of an induced voltage in the deenergized state of a relevant winding phase of the stator winding. For this purpose, first the zero crossing of a winding phase current in the relevant winding phase is detected or predicted and the voltage supply for the phase voltage on the winding phase is deactivated for a predetermined measurement time window, which includes the zero crossing. During the measurement time window, the profile of the induced voltage is determined and, on the basis of the profile of the induced voltage, the zero crossing time of a zero crossing of the induced voltage is calculated. The zero crossing time of the induced voltage can be an indication of the instantaneous rotor position.

Until now, the detection of the zero crossing of the winding phase current in one or a plurality of the winding phases is established by measurement of a voltage drop across a shunt or a voltage drop across one of the power switches in the driver circuit. However, these methods are complex and require the provision of additional measures in order to monitor the current profile of a winding phase current in order to be able to establish the zero crossing thereof. In addition, when using shunts, said shunts need to be connected in series with the winding phases, with losses occurring which can impair the efficiency of the motor system.

It is therefore an object of the present invention to determine a method and an apparatus for determining a zero crossing of a winding phase current in a simple manner, with in particular the complexity in terms of design measures being reduced.

SUMMARY OF THE INVENTION

This object is achieved by the method for determining a zero crossing of a winding phase current and by the method for determining a rotor position of an electric machine, an apparatus for determining a zero crossing of the winding phase current and by the motor system.

In accordance with a first aspect, a method for determining a time of a zero crossing of a winding phase current in a polyphase electric machine is provided. In this case, the electric machine is actuated with the aid of a driver circuit with power switches in order to provide a plurality of phase voltages, which are applied to connection nodes of the electric machine which are associated with corresponding phases, at least some of the power switches being actuable cyclically on the basis of pulse width modulation with a duty factor in order to apply different potentials alternately to one of the connection nodes, said method comprising the following steps:

actuating the driver circuit for providing the phase voltages in order to operate the electric machine;

deactivating the pulse-width-modulated actuation for at least one of the power switches, with the result that, at least during a time segment in each cycle of the pulse width modulation, no potential is applied by the driver circuit to the connection nodes;

detecting a diode voltage across a freewheeling diode, with which the deactivated power switch is provided, within the time segment;

fixing the time of the zero crossing of the winding phase current as the time after which, within the time segment, there is no longer a diode voltage present across the freewheeling diode.

One concept of the above method consists in identifying the occurrence of a winding phase current on the basis of a diode voltage across a freewheeling diode associated with a power switch of the driver circuit. If one of the power switches, which has been operated previously on the basis of pulse width modulation, is deactivated, the potential to be switched by the power switch is not present at the connection node, at least in time segments in which the relevant power switch is switched so as to be conducting. As a result, the connection node is floating.

On the basis of the winding phase current, the freewheeling diode of the deactivated power switch is operated in the forward direction and there is a diode voltage drop which impresses the potential onto the connection node. In particular, a potential which results from the diode voltage and the potential to be switched on by the deactivated power switch is produced at the connection node. In the case of a change in the mathematical sign of the winding phase current, the voltage across the diode corresponds to a voltage which is determined by the electrical circuit, since the freewheeling diode is now operated in the reverse direction. Therefore, by detecting the time at which the diode voltage is zero, it is possible to establish the time after which the freewheeling diode is operated in the reverse direction. This time corresponds to the time of the zero crossing of the winding phase current.

In order to allow the winding phase current to flow through the freewheeling diode, it is necessary, in contrast to the conventional actuation method in which the power switches of the driver circuit are operated alternately in accordance with a duty factor of a pulse width modulation, to deactivate one of the power switches and to permit a diode current through the freewheeling diode associated with the deactivated power switch.

The detection of the time of the zero crossing of the winding phase current as the time at which the diode voltage across the freewheeling diode of the deactivated power switch falls away has the advantage that it is possible to dispense with additional detectors for measuring the winding phase current. The determination of the time of the zero crossing of the winding phase current is based only on the measurement which is required in any case of the connection voltages at the connection nodes for the winding phases of the electric machine.

Furthermore, the deactivation of the pulse-width-modulated actuation for at least one of the power switches can be performed within a measurement time window which begins at a time which is dependent on or corresponds to a time at which the mathematical sign of the phase voltage changes and ends at the earliest at a time at which the zero crossing of the winding phase current has been fixed. In particular, the step of deactivating the pulse-width-modulated actuation can comprise only that power switch being deactivated through which the instantaneous winding phase current effects a diode current in the forward direction.

In accordance with one embodiment, that power switch through which the instantaneous winding phase current effects a diode current in the forward direction can be determined by the gradient of the profile of the phase voltage.

In addition, the duty factor can be between 30% and 70%.

In accordance with a further aspect, a method for determining a rotor position of a rotor of an electric machine is provided. The method comprises the following steps:
determining a time of the zero crossing of a winding phase current with the aid of the above method;
once the time of the zero crossing of the winding phase current has been fixed, determining one or more induced voltages across the winding phase within a further measurement time window, while the power switches of the electric machine which are associated with the winding phase are switched so as to be nonconducting;
determining the rotor position from the at least one induced voltage.

In accordance with a further aspect, an apparatus is provided for determining a time of a zero crossing of a winding phase current in a polyphase electric machine, which is actuated with the aid of a driver circuit with power switches by virtue of a plurality of phase voltages being provided which are applied to connection nodes of the electric machine which are associated with corresponding phases, at least some of the power switches being actuable cyclically on the basis of pulse width modulation with a duty factor in order to apply different potentials alternately to one of the connection nodes in order to provide the respective phase voltage. The apparatus is designed to actuate the driver circuit for providing a plurality of phase voltages in order to operate the electric machine;

to deactivate the pulse-width-modulated actuation for at least one of the power switches, with the result that, at least during a time segment in each cycle of the pulse width modulation, no potential is applied to the connection nodes by the driver circuit;

to detect, within the time segment, a diode voltage across a freewheeling diode with which the at least one deactivated power switch is provided; and to fix the time of the zero crossing of the winding phase current at the time after which, within the time segment, there is no longer a diode voltage present across the freewheeling diode.

In accordance with a further aspect, a motor system is provided. The motor system comprises:
a polyphase electric machine;
a driver circuit, which has inverter circuits, each having series interconnection of power switches connected between a first potential and a second potential;
the above apparatus.

In accordance with a further aspect, a computer program product is provided, which contains a program code which, when run on a data processing unit, implements the above method.

BRIEF DESCRIPTION OF THE DRAWINGS

Preferred embodiments will be explained in more detail below with reference to the attached drawings, in which.

DETAILED DESCRIPTION

Figure 1:
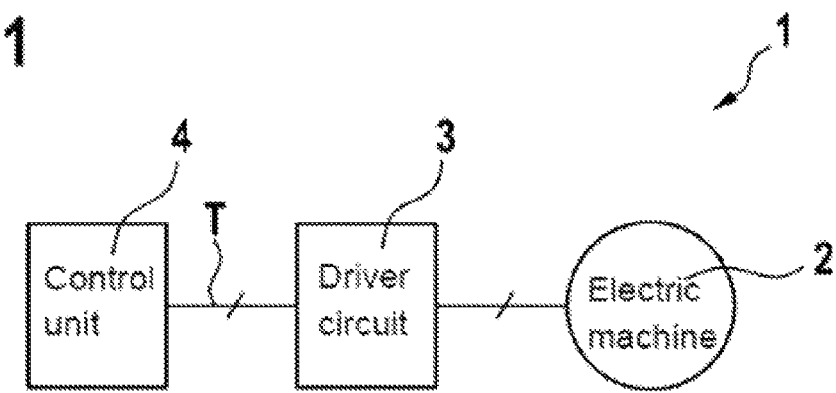
FIG. 1 shows a schematic illustration of a motor system for operating an electric machine.

FIG. 1 shows a schematic illustration of a motor system 1 with an electric machine 2. The electric machine 2 can be in the form of an electronically commutated synchronous machine, asynchronous machine or the like. The electric machine 2 has a phase winding with in general a plurality of winding phases, which can be energized separately by application of a respective phase voltage. Conventional synchronous machines are two-phase or three-phase, for example. The phase voltages required therefor are provided with the aid of a driver circuit 3.

The driver circuit 3 produces the phase voltages depending on the actuating signals T, which are produced by a control unit 4 depending on a rotor position of the electric machine 2. The rotor position of the electric machine 2 corresponds to the instantaneous position of a rotor of the electric machine 2 and, in the case of rotary machines, is specified as position angle.

The position angle for actuating the electric machine 2 is in the present case determined in sensorless fashion in accordance with the back-EMF method by monitoring the winding phase current and by evaluating a level and a profile of an induced voltage within a time window, during which the winding phase is deenergized.

In a first exemplary embodiment, it is assumed there is a motor system 1 in which the driver circuit 3 is in the form of a 2H bridge circuit in order to operate a two-phase electric machine with two winding phases. Such a topology is illustrated in FIG. 2.

Figure 2:
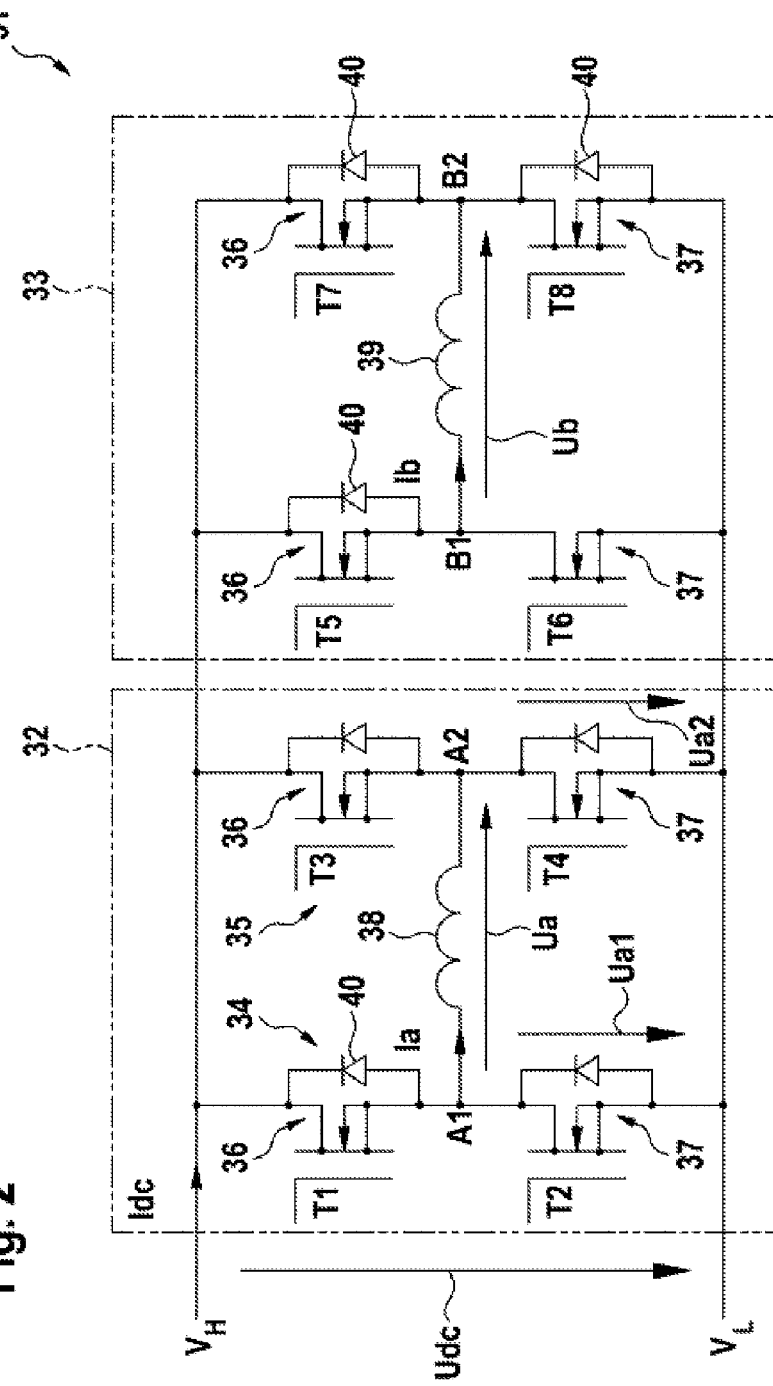
FIG. 2 shows a circuit diagram of a driver circuit with a 2H topology for actuating a two-phase electric machine.

The 2H bridge circuit 31, as is illustrated in FIG. 2, has two H bridges 32, 33, which each comprise two inverter circuits 34, 35. Each of the inverter circuits 34, 35 has a first power switch 36 in the form of a power transistor and a second power switch 37 in the form of a second power transistor. The power transistors can be in the form of MOSFETs, thyristors, IGBTs, IGCTs or the like. The power switches 36, 37 are each connected in series between a high supply potential $V_H$ and a low supply potential $V_L$. A respective connection node A1, A2, B1, B2 between the first and second power switches 36, 37 is connected to one of the winding phases 38, 39 of the electric machine 2. In particular, the connection node A1 of the first inverter circuit 34 of the first H bridge 32 is connected to a first connection of a first winding phase 38 and the connection node A2 of the second inverter circuit 35 of the first H bridge 32 is connected to a second connection of the first winding phase 38. The inverter circuits 36, 37 of the second H bridge 33 are connected in analogous fashion to a second winding phase 39.

The control unit 4 provides actuating signals T1-T8 for actuating the individual power transistors 36, 37 of the inverter circuits 34, 35 of the H bridges 32, 33. By means of the actuating signals, the power transistors can be operated as switches which can be switched so as to be conducting or nonconducting.

Freewheeling diodes 40, which are connected between the high supply potential $V_H$ and the low supply potential $V_L$ in the reverse direction with respect to the applied supply voltage, are provided in parallel with the power switches 36, 37. The freewheeling diodes 40 can be formed intrinsically with the respective power switches 36, 37 or separately.

In order to effect a positive phase current in the first winding phase 38 (current direction from left to right, as indicated by the arrow), a positive phase voltage can be provided by actuating the power transistors 36 and 37 of the first H bridge 32 on the basis of a suitable pulse width modulation. At the same time, the second power switch 37 of the second inverter circuit 35 of the first H bridge 32 is switched so as to be conducting and the first power switch 36 of the second inverter circuit 35 of the first H bridge 32 is switched so as to be nonconducting.

If a negative phase voltage is intended to be applied, a phase voltage is applied by the first and the second power switches 36, 37 of the second inverter circuit 35 of the first H bridge 32 on the basis of a suitable pulse width modulation. Correspondingly, the second power switch 37 of the first inverter circuit 34 of the first H bridge 32 is switched so as to be conducting and the first power switch 36 of the first inverter circuit 34 of the first H bridge 32 is switched so as to be nonconducting.

The actuations for adjusting a positive or negative phase voltage at the second winding phase 39 are analogous.

The pulse width modulation represents cyclic actuation. The phase voltage adjusted by pulse width modulation can be adjusted by selecting a duty factor. The duty factor indicates a ratio of a time period during which the high supply potential $V_H$ is applied with respect to a total time period which corresponds to the cycle time of the pulse width modulation.

In the text which follows, the method for detecting a time of the zero crossing of one of the motor currents Ia, Ib is explained only on the basis of the first H bridge 32. In order to determine the rotor position, this method is generally implemented for both H bridges. In order to detect the time of the zero crossing of the winding phase current Ia, the mode of operation is altered during a predetermined measurement time window. While the clocked inverter circuit 34, 35, which is operated on the basis of the pulse width modulation, envisages the first and second power switches 36, 37 being alternately switched so as to be conducting and correspondingly nonconducting during normal operation, in the measurement time window one of the power switches 36, 37 of the inverter circuit, which is operated on the basis of the pulse width modulation, i.e. is clocked, is switched so as to be permanently nonconducting, with the result that said power switch is excluded from the clocking by the pulse width modulation. In the exemplary embodiment shown, when the phase voltage is positive and the winding phase current is positive and falling, the second power switch 37 of the first inverter circuit 34 is switched so as to be nonconducting and the clocking predetermined by the pulse width modulation continues only with the first power switch 36. In other words, during the measurement time window, that one of the power switches 36, 37 of the inverter circuit 34, 35 operated on the basis of the pulse width modulation is switched so as to be nonconducting, with the result that the winding phase current through the freewheeling diode 40 associated with the power switch effects a diode current in the forward direction and thus a diode voltage.

The measurement time window is preferably selected such that the zero crossing of the winding phase current can be expected within this measurement time window. Since the profile of the winding phase current generally lags the profile of the phase voltage in the relevant winding phase, it is sufficient to fix the beginning of the measurement time window at the zero crossing of the phase voltage or shortly before this. This is possible in a simple manner since the profiles of the phase voltages to be applied are known in the control unit. Also, the actuating signals T1 to T8 are determined from the phase voltages.

Owing to the inductive load of the respective winding phase 38, 39 and owing to the induction of an induced voltage as the result of a movement of the rotor, the winding phase current continues to flow during the measurement time window, for example in the case of the second power switch 37 being deactivated, i.e. switched so as to be nonconductive (switched off). In the time periods within the measurement time window during which, owing to the pulse-width-modulated actuation of the first power switch 36, the first power switch 36 is switched off (time window in each cycle of the pulse width modulation from breaking of the first power switch 36 to making of the first power switch 36 in the next cycle), the winding phase current flows through the freewheeling diode 40 of the second power switch 37. The corresponding freewheeling diode 40 is in this case operated by the winding phase current in the forward direction and results in a voltage drop between the low supply potential $V_L$ and the relevant connection node A1, A2 for the first winding phase 38. The winding phase current flows through the freewheeling diode 40 of the second power switch 37 as long as the winding phase current flows from the connection node A1 or A2 into the first winding phase 38 and the second power switch 37 is off. This can be seen from the more detailed illustration of the current and voltage profiles and the signal profiles for actuating the first and second power switches 36, 37 in FIG. 4. It can be seen in this regard that a potential UA1 which is below the level of the low supply potential is present at the first connection node A1 during the measurement time window, while the actuation takes place with a positive phase voltage.

This applies analogously also to the case in which the first power switch 36 is deactivated, i.e. switched so as to be nonconducting, with simultaneous continued operation of the second power switch 37, in which case the corresponding freewheeling diode 40 in parallel with the first power switch 36 is operated by the diode current in the forward direction and results in a voltage drop between the relevant connection node A1, A2 and the high supply potential $V_H$. The diode current flows through the freewheeling diode 40 of the first power switch 36 as long as the winding phase current flows from the first winding phase 38 to the connection node A1 or A2 and the first power switch 36 is permanently off.

Figure 3:
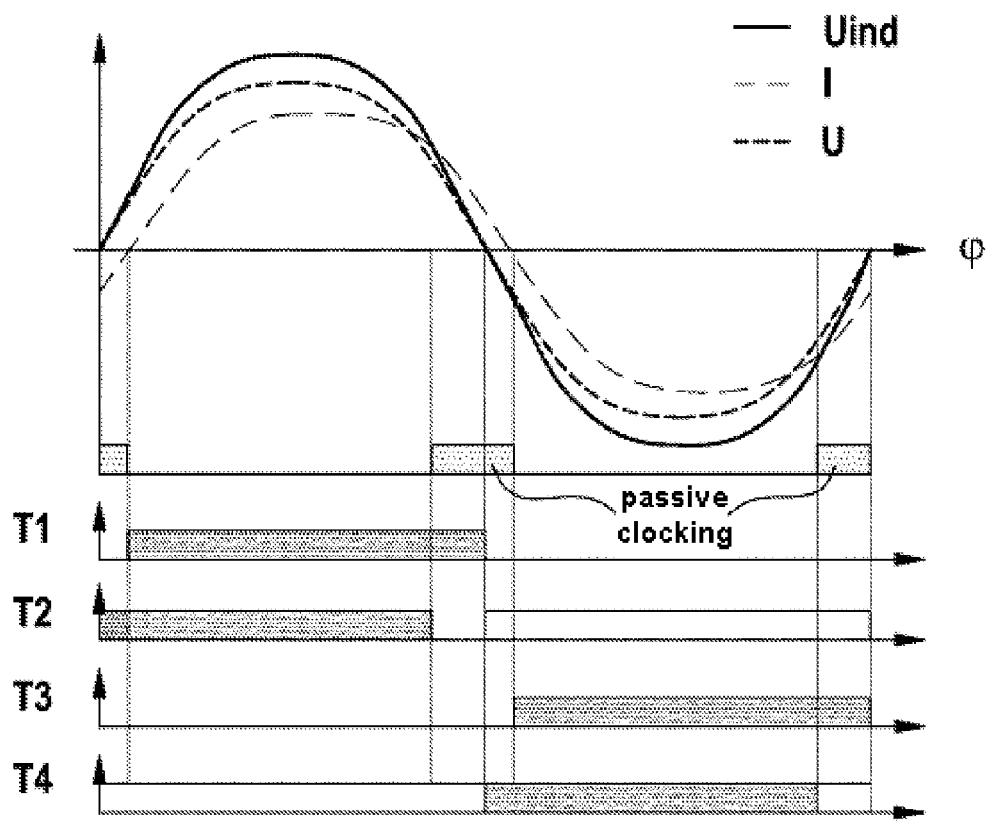
FIG. 3 shows a schematic illustration of the profiles of a winding phase current through a winding phase, a voltage induced in the winding phase and the applied phase voltage, and the corresponding switching signals for the power switches in one of the H bridges for operating a winding phase.

In the case of the 2H bridge circuit, as is shown in FIG. 3, in each case only one of the inverter circuits of each H bridge is operated in accordance with a pulse width modulation and the power switches of the respective other inverter circuit are switched in such a way that the required winding phase current can be provided from one of the supply potentials. That is to say that, if a winding phase current flows into the respective inverter circuit which is not actuated on the basis of the pulse width modulation, the second power switch 37 is switched so as to be conducting and the first power switch 37 is switched so as to be nonconducting, and vice versa.

If, in one phase, the phase voltage to be effected by the actuating signals reaches a zero crossing, in the case of the 2H bridge circuit the pulse-width-modulated actuation transfers to the corresponding other inverter circuit of the H bridge associated with the relevant phase and the power switches 36, 37 of the respective other inverter circuit 34, 35 are switched, as described above, in such a way that the required winding phase current can be provided from one of the supply potentials $V_L$, $V_H$.

Figure 4:
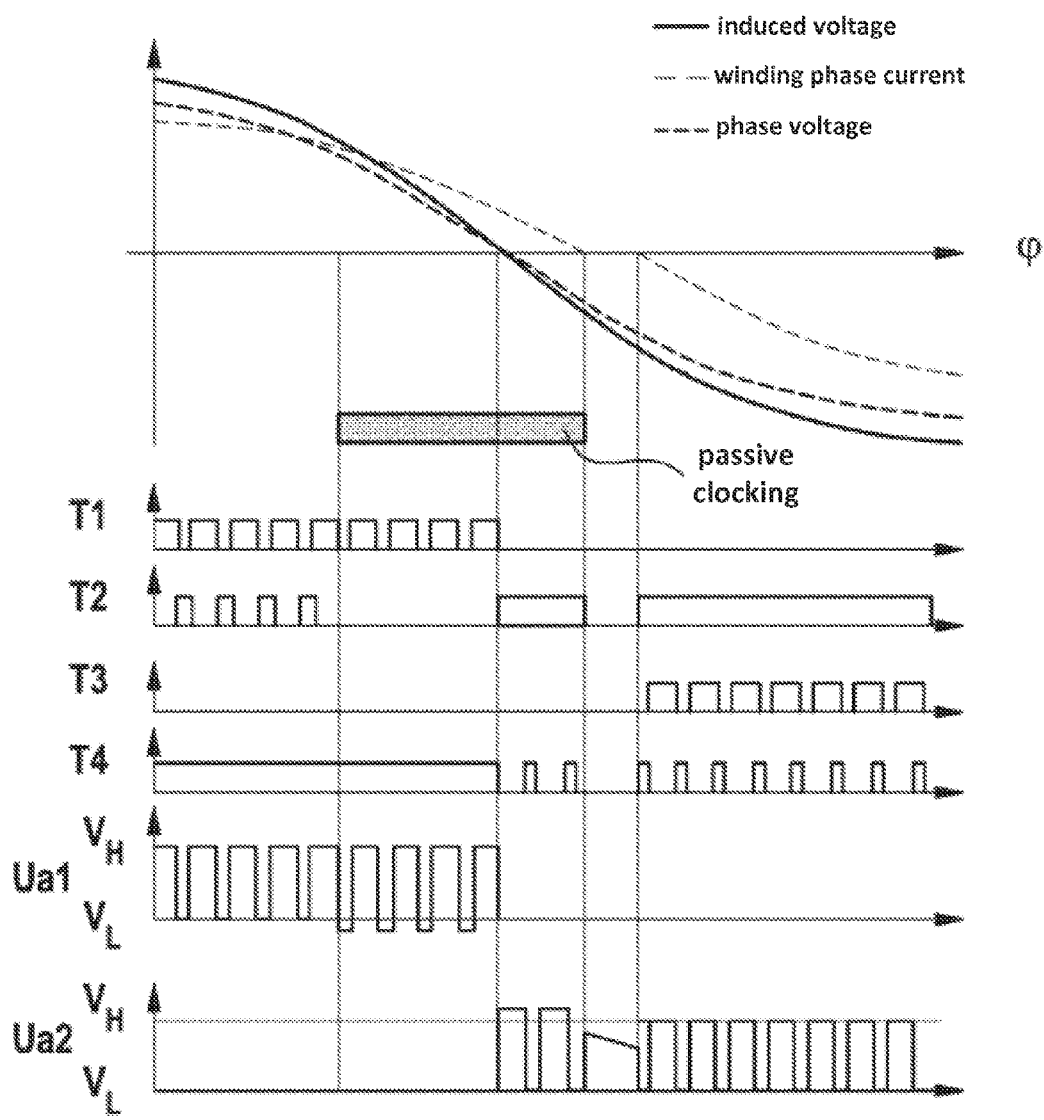
FIG. 4 shows a more detailed illustration of the profiles of the winding phase current through the winding phase, the induced voltage and the phase voltage, the actuating signals for the power switches and the resulting connection voltages in a region of the zero crossing of the winding phase current.

Once, in the example shown in FIG. 4, a negative voltage is applied as phase voltage, the pulse width modulation takes place by the second inverter circuit 35. In order to achieve a voltage drop there across a freewheeling diode 40 operating in the forward direction of one of the power switches 36, 37 in order to detect the winding phase current in the case of the still positive winding phase current Ia, it is now necessary for the first power switch 36 of the second inverter circuit 35 to remain deactivated during the measurement time window and for the pulse width modulation to be performed merely with the aid of the second power switch 37 of the second inverter circuit 35. This takes place with the first power switch 36 off and the second power switch 37 of the first unclocked inverter circuit conducting.

During the measurement time window, as long as and if the phase voltage applied to the winding phase is positive, the potential at the first connection node A1 is monitored. In the actuation breaks in the cyclic actuation of the first power switch 36 of the clocked inverter circuit, i.e. when the first power switch 36 is switched so as to be nonconducting on the basis of the duty factor, it is possible to establish whether a diode voltage has been added in parallel with the second power switch 36 of the first inverter circuit 34 on the basis of the conducting freewheeling diode. This becomes apparent at the first connection node A1 by virtue of the fact that there is a voltage present across the second power switch 37 of the first inverter circuit 34 which is more negative than the low supply potential $V_L$.

Once the pulse width modulation has switched over to the second inverter circuit 35, in the case of a negative phase voltage the flow of a winding phase current through a freewheeling diode of the deactivated first power switch 36 of the second inverter circuit 35 can be established when the voltage potential present at the second connection node A2 exceeds the high supply potential $V_H$ by a diode voltage of the freewheeling diode. This will be the case at the beginning of the measurement time window since a winding phase current flows in the positive direction. If, however, the winding phase current reaches the zero crossing, no freewheeling current can flow any more and the corresponding voltage drop across the corresponding freewheeling diode which has been excluded from the clocking no longer occurs. The zero crossing of the winding phase current can therefore be established, in accordance with the abovedescribed procedure, as the time after which it is not possible to detect a diode voltage drop across the relevant freewheeling diode.

If the time of the zero crossing of the winding phase current is reached, in order to determine the rotor position, the first and second power switches 36, 37 of the inverter circuits 34, 35 which are connected to the relevant winding phase are switched off during a further measurement time window and the level and/or gradient of the voltage $U_{ind}$ induced across the winding phase 38, 39 is determined.

The level of the voltage $U_{ind}$ induced across the winding phase 38, 39 can take place by measurement of the voltage potentials at the first and second connection nodes A1, A2 or of the voltages across the second power switch 37 and subsequent formation of a difference between the values thus obtained. The gradient of the induced voltage can be determined by repeated measurement, with a time offset, of the voltage potentials or the voltages at the connection node A1, A2 and subsequent formation of the difference in order to obtain two values. From this and with the aid of the time interval between the measurements within the further measurement time window, the time gradient of the profile of the induced voltage within the further measurement time window can be determined in a known manner.

With the aid of the gradient and the level of the measured induced voltage, it is possible to draw a conclusion on the zero crossing of the induced voltage approximately, for example by linear regression, for example by calculation of a zero crossing of a straight line with a pitch at the level of the measured gradient and on the basis of the measured level of the induced voltage at a specific point in time within the further measurement time window. The time of the zero crossing of the induced voltage can be used as a measure of the rotor position. If, on the basis of the above method, the time of the zero crossing of the winding phase current has been determined and the induced voltage within the further measurement time window has been determined, the actuation of the electric machine in accordance with the normal operating mode is resumed, i.e. the pulse-width-modulated actuation of both power switches 36, 37 of the inverter circuit which has most recently been actuated on the basis of the pulse width modulation, in this case the second inverter circuit 35, is resumed.

The principle of the abovedescribed actuation method envisages that, in the case of a polyphase electronically commutated electric machine which is operated with the aid of pulse-width-modulated phase voltages, one of the power switches 36, 37 of the clocked inverter circuit is excluded in a measurement time window in which a zero crossing of the winding phase current is expected and is switched off completely for the duration of the measurement time window. The off power switch of the clocked inverter circuit corresponds to the power switch at which a diode current occurs in the forward direction on the basis of the corresponding winding phase current.

If the winding phase current then reaches the zero crossing, the freewheeling current also becomes zero and there is no diode voltage drop across the corresponding freewheeling diode 40 anymore. Instead, the polarity now prevailing turns the freewheeling diode off, with the result that there is a voltage drop across the diode which corresponds to the voltage across the associated power switch. The time at which the diode voltage falls away, which can be detected by corresponding monitoring and evaluation of the connection potentials at the first connection A1 and at the second connection A2, can be determined as the time of the zero crossing of the winding phase current.

Figure 5:
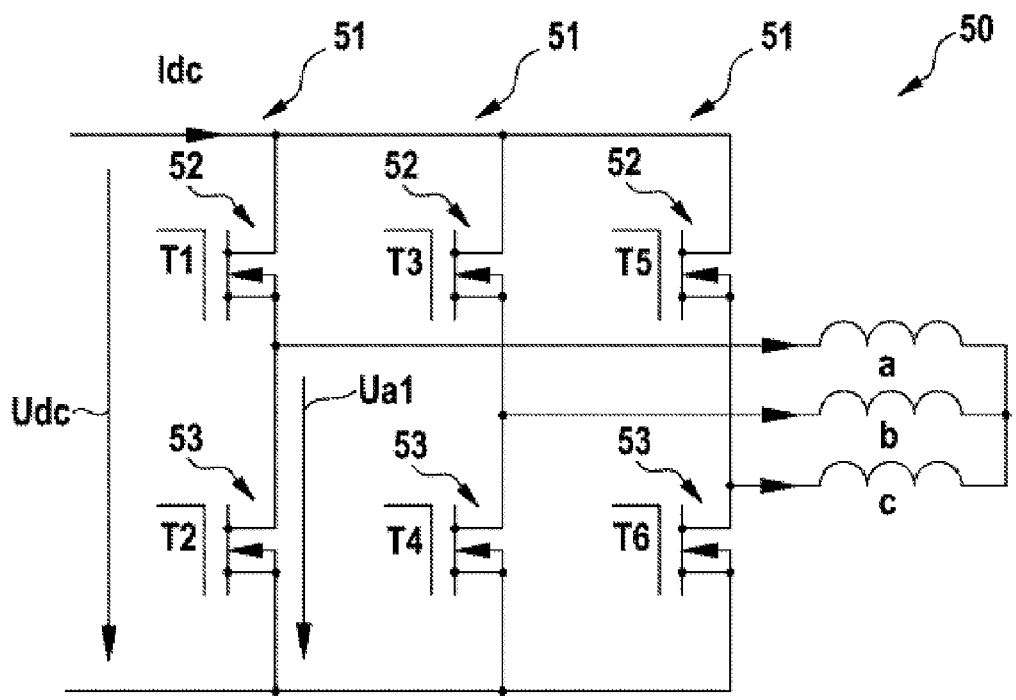
FIG. 5 shows a circuit diagram of a B6 driver circuit for actuating a three-phase electric machine.

FIG. 5 illustrates a B6 bridge circuit 50 as an alternative driver circuit for the motor system 1. The B6 bridge circuit 50 is suitable in particular for actuating a three-phase electric machine. The B6 bridge circuit 50 has three inverter circuits 51, which, as before, each have a first power switch 52 and a second power switch 53. As in the exemplary embodiment in FIG. 2, the individual power switches 52, 53 are connected in series, with a winding phase of the electric machine 2 to be operated being connected to the connection node A between the power switches 52, 53. In the exemplary embodiment shown, the winding phases are star-connected, but it is also possible for other types of interconnection of the winding phases of the electric machine to be provided. Each of the power switches 52, 53 is provided with a freewheeling diode 54, which can be formed intrinsically or separately, as described above.

In the case of the B6 bridge circuit 50, each of the inverter circuits 51 is associated with a phase, i.e. a winding phase of the electric machine. In the case of the B6 bridge circuit, the inverter circuits 51 are each actuated on the basis of an actuation pattern by the control unit 4, said actuation pattern corresponding to a pulse width modulation with a specific duty factor. Thus, by selecting the individual phase voltages, the desired voltage phasor can be applied to the electric machine 2. In principle, in order to establish the time of the zero crossing of a winding phase current of a phase, the inverter circuit 51 associated with the phase is operated during the measurement time window on the basis of passive clocking. The measurement time window is selected such that it begins safely before the zero crossing of the relevant winding phase current is reached, for example at the time of a zero crossing of the relevant phase voltage or prior to this time, and ends at the earliest with the detection of the time of the zero crossing of the winding phase current.

If the winding phase current at the time of the beginning of the measurement time window is positive (i.e. the current flows from the relevant inverter circuit into the electric machine), the relevant second power switch 53 is switched so as to be nonconducting for passive clocking, while the first power switch 52 continues to be operated with the corresponding pulse-width-modulated actuation signal. If the winding phase current at the time of the beginning of the measurement time window is negative, instead the first power switch 52 is switched off, while the second power switch 53 is correspondingly clocked. In the last mentioned case, the actuating signal for the second power switch 53 is still the signal which causes the second power switch 53 to be switched on during normal operation (i.e. outside the passive clocking), while the first power switch 52 is switched off.

That power switch 52, 53 by means of which the instantaneous winding phase current effects a diode current in the forward direction can be determined, for example, by the gradient of the profile of the predetermined phase voltage. If the gradient is positive, a zero crossing of the phase voltage in the direction of positive values takes place, which, with a time lag, effects a zero crossing of the winding phase current from the negative winding phase current to a positive winding phase current. That is to say that, at the beginning of the measurement time window, the winding phase current is negative and flows from the winding phase into the relevant connection node. In this case, only the freewheeling diode of the first power switch 52 could be operated in the forward direction. Therefore, the clocking of the first power switch 52 during the measurement time window is deactivated. If the gradient is negative, a zero crossing of the phase voltage in the direction of negative values takes place, which effects, with a time lag, a zero crossing of the winding phase current from a positive winding phase current to a negative winding phase current. That is to say that, at the beginning of the measurement time window, the winding phase current is positive and flows from the relevant connection node into the winding phase. In this case, only the freewheeling diode of the second power switch 53 could be operated in the forward direction. Therefore, the clocking of the second power switch 53 is deactivated during the measurement time window.

Figure 6:
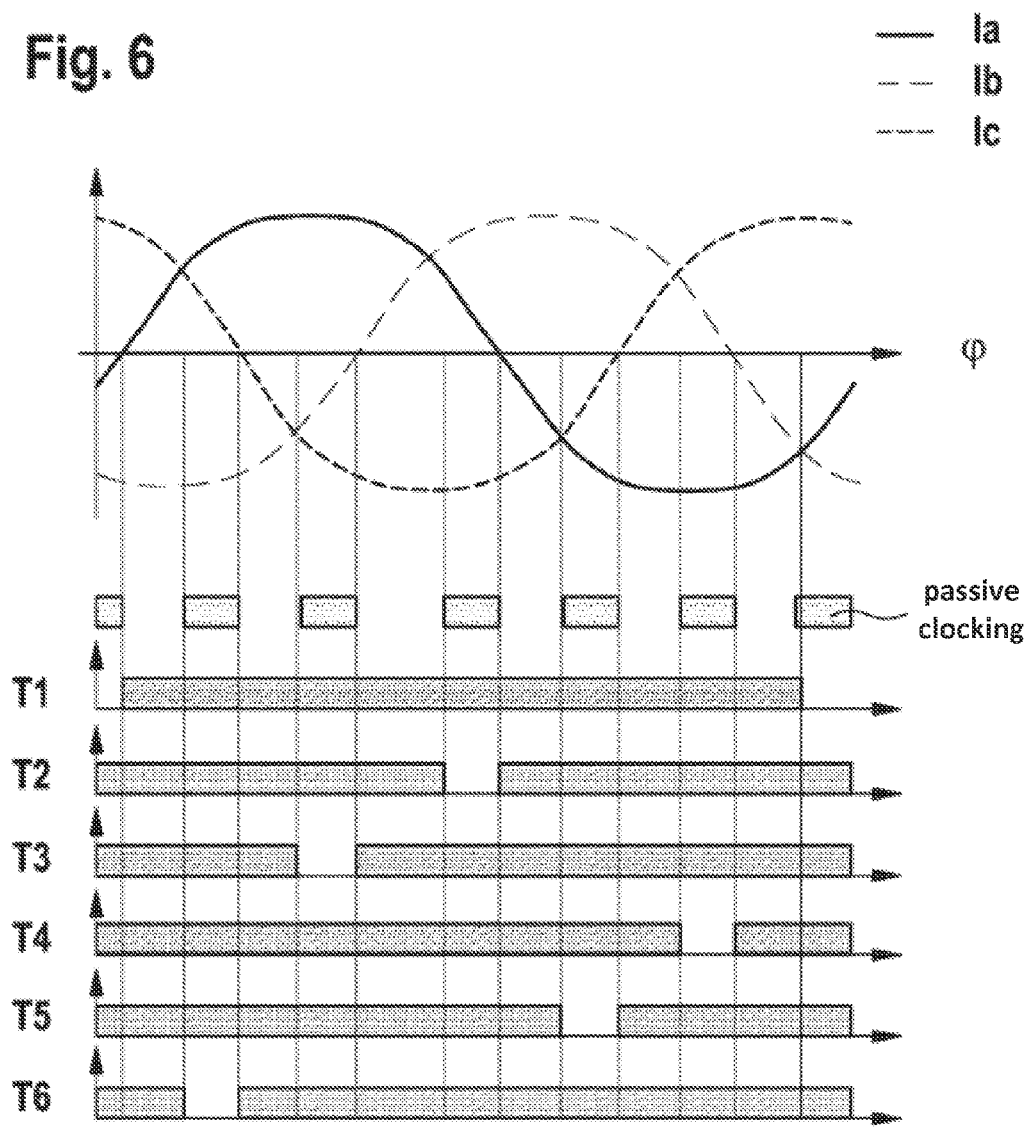
FIG. 6 shows an illustration of the profiles of the phase currents and the associated actuating signals of the power switches.

FIG. 6 shows the profiles of the winding phase currents Ia, Ib, Ic and the corresponding signal profiles of the actuating signals T1 to T6 for the power switches 52, 53 and the individual time windows for the passive clocking during which the corresponding actuating signal for in each case one of the power switches 52, 53 is switched so as to switch the relevant power switch 52, 53 so as to nonconducting (switch said power switch off).

Figure 7:
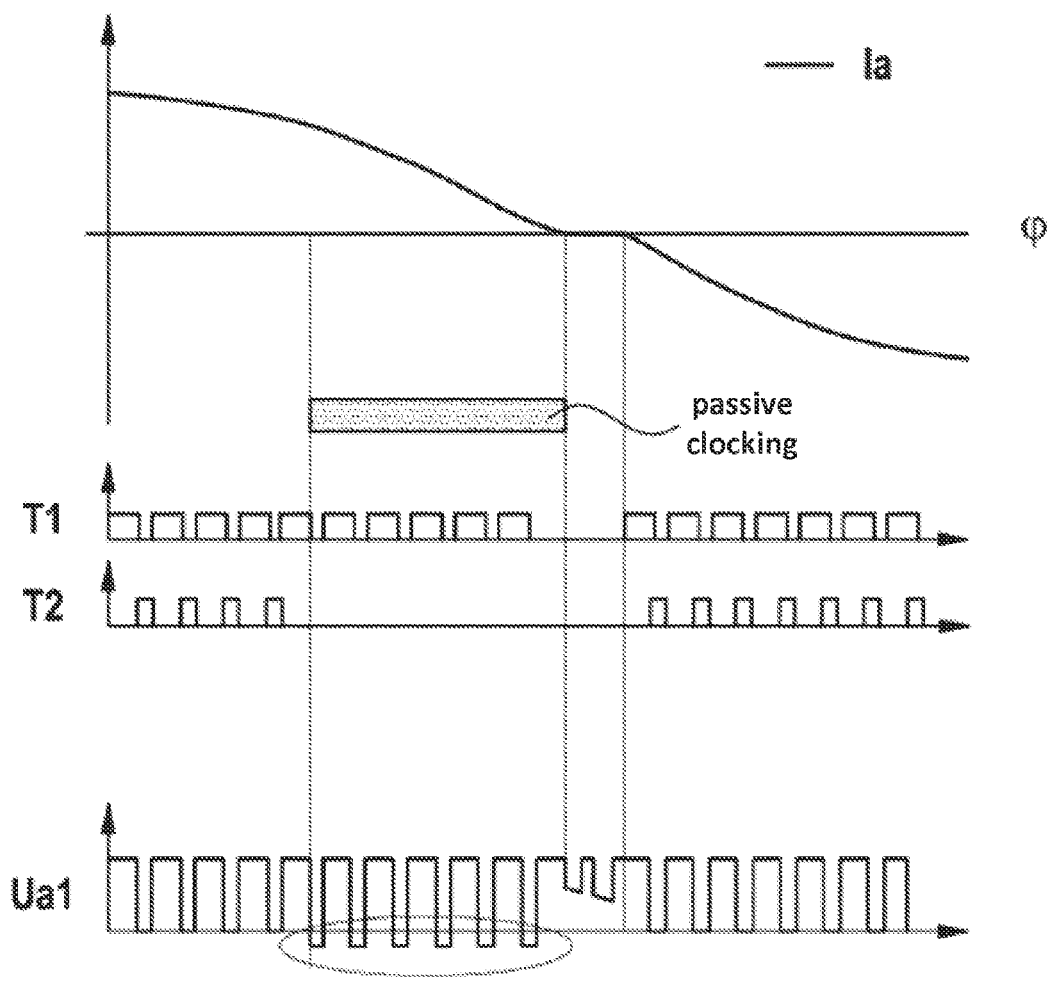
FIG. 7 shows a more detailed illustration of the profile of one of the phase currents through one of the winding phases, corresponding actuation of the associated power switches and the resulting connection potential.

Analogously to the above described embodiment, FIG. 7 illustrates the passive clocking for one of the inverter circuits 51 of the B6 circuit. Analogously to the above described case, in this case too, the time of the zero crossing of the relevant winding phase current is established as the time when the winding phase current no longer effects a diode voltage across the freewheeling diode 54 of the deactivated power switch 52, 53.

As previously described, when the time of the zero crossing of the relevant winding phase current has been established, it is possible to draw a conclusion on a rotor position with the aid of known methods by measuring a level and a gradient of an induced voltage at the corresponding winding phase within a further measurement time window directly following the time of the zero crossing of the winding phase current.

The invention claimed is:
1. A method for determining a time of a zero crossing of a winding phase current in a polyphase electric machine (2), the electric machine (2) being actuated with the aid of a driver circuit (31; 50) with power switches (36; 37; 52, 53) in order to provide a plurality of phase voltages, which are applied to connection nodes (A1, A2, B1, B2) of the electric machine (2) which are associated with corresponding phases, at least some of the power switches (36, 37; 52, 53) being actuable cyclically on the basis of pulse width modulation with a duty factor in order to apply different potentials alternately to one of the connection nodes (A1, A2, B1, B2), said method comprising the following steps:

actuating the driver circuit (31; 50) for providing the phase voltages in order to operate the electric machine (2);

deactivating the pulse-width-modulated actuation for at least one of the power switches (36, 37; 52, 53), such that, at least during a time segment in each cycle of the pulse width modulation, no potential is applied by the driver circuit (31; 50) to the connection nodes (A1, A2, B1, B2);

detecting a diode voltage across a freewheeling diode, with which the deactivated power switch (36, 37; 52, 53) is provided, within the time segment; and fixing the time of the zero crossing of the winding phase current as the time after which, within the time segment, there is no longer a diode voltage present across the freewheeling diode (40; 54).

2. The method as claimed in claim 1, wherein the deactivation of the pulse-width-modulated actuation for at least one of the power switches (36, 37; 52, 53) is performed within a measurement time window which begins at a time which is dependent on or corresponds to a time at which the mathematical sign of the phase voltage changes and ends at the earliest at a time at which the zero crossing of the winding phase current has been fixed.

3. The method as claimed in claim 2, wherein the step of deactivating the pulse-width-modulated actuation comprises only that power switch (36, 37; 52, 53) being deactivated through which the instantaneous winding phase current effects a diode current in the forward direction.

4. The method as claimed in claim 3, wherein that power switch (36, 37; 52, 53) through which the instantaneous winding phase current effects a diode current in the forward direction is determined by the gradient of the profile of the phase voltage.

5. The method as claimed in claim 1, wherein the duty factor is between 30% and 70%.

6. A method for determining a rotor position of a rotor of an electric machine (2), said method comprising the following steps:

determining a time of the zero crossing of a winding phase current with the aid of a method as claimed in claim 1;

once the time of the zero crossing of the winding phase current has been fixed, determining one or more induced voltages across the winding phase (38, 39) within a further measurement time window, while the power switches of the electric machine which are associated with the winding phase are switched so as to be nonconducting; and determining the rotor position from the at least one induced voltage.

7. A non-transitory computer readable medium, which includes a program code which, when run on a data processing unit, implements the method as claimed in claim 1.

8. An apparatus for determining a time of a zero crossing of a winding phase current in a polyphase electric machine (2), which is actuated with the aid of a driver circuit (3; 31; 50) with power switches (36, 37; 52, 53) by virtue of a plurality of phase voltages being provided which are applied to connection nodes of the electric machine (2) which are associated with corresponding phases, at least some of the power switches being actuable cyclically on the basis of pulse width modulation with a duty factor in order to apply different potentials alternately to one of the connection nodes in order to provide the respective phase voltage, wherein the apparatus is configured:

to actuate the driver circuit (3; 31; 50) for providing a plurality of phase voltages in order to operate the electric machine (2);

to deactivate the pulse-width-modulated actuation for at least one of the power switches (36, 37; 52, 53), with the result that, at least during a time segment in each cycle of the pulse width modulation, no potential is applied to the connection nodes (A1, A2, B1, B2) by the driver circuit (3; 31; 50);

to detect, within the time segment, a diode voltage across a freewheeling diode (40; 54) with which the at least one deactivated power switch (36, 37; 52, 53) is provided;

to fix the time of the zero crossing of the winding phase current at the time after which, within the time segment, there is no longer a diode voltage present across the freewheeling diode (40; 54).

9. A motor system (1), comprising:

a polyphase electric machine (2);

a driver circuit (3), which has inverter circuits (34, 35, 51), each having series interconnection of power switches (36, 37; 52, 53) connected between a first potential and a second potential;

an apparatus as claimed in claim 8.

\* \* \* \* \*